(12) United States Patent
Kimbel et al.

(10) Patent No.: US 6,241,818 B1
(45) Date of Patent: Jun. 5, 2001

(54) METHOD AND SYSTEM OF CONTROLLING TAPER GROWTH IN A SEMICONDUCTOR CRYSTAL GROWTH PROCESS

(75) Inventors: Steven L. Kimbel; Robert R. Wyand, III, both of St. Charles, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 09/287,916

(22) Filed: Apr. 7, 1999

(51) Int. Cl.$^7$ ..................................................... C30B 15/20
(52) U.S. Cl. ................... 117/13; 117/14; 117/15; 117/201; 117/202
(58) Field of Search ................ 117/13, 14, 15, 117/201, 202

(56) References Cited

U.S. PATENT DOCUMENTS

| | | | |
|---|---|---|---|
| 3,761,692 | 9/1973 | Cope | 235/151.1 |
| 4,299,651 | 11/1981 | Bonner | 156/617 |
| 4,857,278 | 8/1989 | Gevelber et al. | 422/249 |
| 4,973,377 | 11/1990 | Katsuoka et al. | 156/601 |
| 5,170,061 | * 12/1992 | Baba | 117/14 |
| 5,178,720 | 1/1993 | Frederick | 156/618 |
| 5,223,078 | 6/1993 | Maeda et al. | 156/601 |
| 5,487,355 | 1/1996 | Chiou et al. | 117/13 |
| 5,653,799 | 8/1997 | Fuerhoff | 117/14 |
| 5,665,159 | 9/1997 | Fuerhoff | 117/201 |
| 5,846,318 | 12/1998 | Javidi | 117/14 |
| 5,882,402 | 3/1999 | Fuerhoff | 117/201 |
| 5,961,716 | * 10/1999 | White et al. | 117/14 |
| 5,968,263 | * 10/1999 | Grover et al. | 117/14 |

FOREIGN PATENT DOCUMENTS

| | | |
|---|---|---|
| 0 134 680 A2 | 3/1985 | (EP) . |
| 2 140 704 | 12/1984 | (GB) . |
| 55130895 | 11/1980 | (JP) . |

OTHER PUBLICATIONS

"Computer Simulation and Controlled Growth of Large Diameter Czochralski Silicon Crystals," Kim et al., J. Electrochem Society, May 1983, pp. 1156–1160.

Kuwano, Y. et al., "High Quality Nd: YAG Crystal Growth By An Automated Pulling System", 298 *NEC Research & Development*, No. 91, Tokyo, Japan, pp. 11–17, Oct. 1988.

* cited by examiner

*Primary Examiner*—Robert Kunemund
(74) *Attorney, Agent, or Firm*—Senniger, Powers, Leavitt & Roedel

(57) ABSTRACT

A method and system for controlling growth of a taper portion of a semiconductor single crystal based on the slope of the taper. A crystal drive unit pulls the growing crystal from a melt at a target pull rate that substantially follows an initial velocity profile for growing the taper. A controller calculates a taper slope measurement as a function of a change in crystal diameter relative to a change in crystal length. The controller then generates an error signal as a function of the difference between the taper slope measurement and a target taper slope and provides a pull rate correction to the crystal drive unit as a function of the error signal. In turn, the crystal drive unit adjusts the pull rate according to the pull rate correction to reduce the difference between the taper slope measurement and the target taper slope. The target taper slope is defined by a function having a generally exponential component and a generally linear component.

18 Claims, 5 Drawing Sheets

METHOD AND SYSTEM OF CONTROLLING TAPER GROWTH IN A SEMICONDUCTOR CRYSTAL GROWTH PROCESS

BACKGROUND OF THE INVENTION

This invention relates generally to improvements in controlling growth processes of single crystal semiconductors for use in the manufacture of electronic components and, particularly, to a closed loop method and system for accurately controlling taper growth in a Czochralski crystal growth process.

Monocrystalline, or single crystal, silicon is the starting material in most processes for fabricating semiconductor electronic components. Crystal pulling machines employing the Czochralski process produce the majority of single crystal silicon. Briefly described, the Czochralski process involves melting a charge of high-purity polycrystalline silicon in a quartz crucible located in a specifically designed furnace. After the heated crucible melts the silicon charge, a crystal lifting mechanism lowers a seed crystal into contact with the molten silicon. The mechanism then withdraws the seed to pull a growing crystal from the silicon melt.

After formation of a crystal neck, the typical process enlarges the diameter of the growing crystal by decreasing the pulling rate and/or the melt temperature until a desired diameter is reached. By controlling the pull rate and the melt temperature while compensating for the decreasing melt level, the main body of the crystal is grown so that it has an approximately constant diameter (ie., it is generally cylindrical). Near the end of the growth process but before the crucible is emptied of molten silicon, the process gradually reduces the crystal diameter to form an end cone. Typically, the end cone is formed by increasing the crystal pull rate and heat supplied to the crucible. When the diameter becomes small enough, the crystal is then separated from the melt. During the growth process, the crucible rotates the melt in one direction and the crystal lifting mechanism rotates its pulling cable, or shaft, along with the seed and the crystal, in an opposite direction.

Although presently available Czochralski growth processes have been satisfactory for growing single crystal silicon useful in a wide variety of applications, further improvements are still desired. For example, a consistent and repeatable seed-end taper shape will help maintain a consistent value of maximum thermal stress, consistent heat transfer in the early body growth and improved reliability of diameter measurement systems. For these reasons, taper growth control for growing the taper to a repeatable shape is desired to improve taper consistency and repeatability.

Conventional taper growth control often involves controlling the heat into the melt by trial and error tuning. In the alternative, the heat is controlled by a control method, such as controlling a given measured temperature based on a preset temperature profile (i.e., target temperature vs. taper diameter). U.S. Pat. No. 5,223,078 and U.S. Pat. No. 4,973,377, the entire disclosures of which are incorporated herein by reference, describe conventional taper growth control.

For example, Maeda et al., U.S. Pat. No. 5,223,078 teaches a method of controlling the growth of the conical portion of the crystal adjacent the seed crystal (i.e., the taper). This method requires the active measurement and adjustment of process variables during growth of the taper. In the Maeda method, the melt temperature and diameter of the taper of the crystal being grown are measured. The change rate of the diameter is calculated and this change rate together with the measured temperature are compared to preset target temperature and change rate values. The target temperature is then determined again based on existing data from a target temperature data file and a target diameter change rate data file. The amount of electricity supplied to the heater is then controlled by a proportional-integral-derivative (PID) controller to obtain the corrected target temperature. In this manner, Maeda et al. attempt to make the length of the taper as short as possible.

Katsuoka et al., U.S. Pat. No. 4,973,377 describes a method of controlling the diameter of the taper by controlling the melt temperature and the rotational speed of the crucible. In this method, the control range of the crucible's rotational speed is made narrower as the diameter of the tapered portion approaches closer to that of the crystal's body portion and is made constant while the body portion is grown.

These approaches, however, are not entirely satisfactory. In U.S. Pat. No. 5,223,078, we are taught to use radiation thermometry as a secondary feedback to control melt temperature. This method has been tried, and failed, due to infrequent pyrometry blockage during machine set-up, SiO accumulation in the radiation viewpath and differences in pyrometer gain from device to device, for example. In addition to this same method of temperature control, U.S. Pat. No. 4,973,377 teaches a method of adjusting crucible rotation rate to adjust the melt temperature. The adjustment of the crucible rotation rate changes the radial flow velocity of the melt, and thereby introduces additional control dynamics, potentially destabilizing the control of the diameter. Additionally, as the modification of the crucible rotation changes the diffusion layer thickness of oxygen in the melt at the crucible wall, adjusting the crucible rotation rate will also adjust the oxygen content incorporated into the crystal. Since control of the oxygen is generally to a specification of a customer, it is not desired to modify the oxygen content in order to control the taper shape. Conversely, it is desired to control the taper shape independently of oxygen concentration adjustments. Moreover, the control techniques taught by these patents fail to provide adequate taper growth repeatability.

For these reasons, a method and system of controlling taper growth is desired that involves a preset temperature profile in combination with adjustment of pull speed to provide taper growth control for growing the taper to a repeatable shape to improve taper consistency and repeatability.

SUMMARY OF THE INVENTION

The invention meets the above needs and overcomes the deficiencies of the prior art by providing an improved method and system of control and operation. Among the several objects and features of the present invention may be noted the provision of such method and system that grow the taper portion of a growing crystal to a repeatable shape; the provision of such method and system that maintain a consistent value of maximum thermal stress during taper growth; the provision of such method and system that maintain consistent heat transfer in the early body growth; and the provision of such method that can be carried out efficiently and economically and such system that is economically feasible and commercially practical.

Briefly described, a method embodying aspects of the present invention is for use in combination with an apparatus for growing a semiconductor single crystal according to the Czochralski process. The apparatus has a heated crucible containing a semiconductor melt from which the crystal is grown on a seed crystal that is pulled from the melt. The method includes pulling the crystal from the melt at a target pull rate that substantially follows an initial velocity profile for growing a taper portion of the crystal. The method also includes the steps of measuring a slope of the taper portion of the crystal and defining a target taper slope. The measured taper slope is a function of a change in crystal diameter relative to a change in crystal length during pulling of the taper portion of the crystal. The method further includes generating an error signal as a function of the difference between the measured taper slope and the target taper slope, adjusting the pull rate as a function of the error signal to reduce the difference between the measured taper slope and the target taper slope, and pulling the crystal from the melt at the adjusted target pull rate. In this manner, the method changes the measured slope of the taper portion of the crystal to control the growth of the crystal.

Generally, another form of the invention is a system for use in combination with an apparatus for growing a semiconductor single crystal according to the Czochralski process. The apparatus has a heated crucible containing a semiconductor melt from which the crystal is grown on a seed crystal that is pulled from the melt by a crystal drive unit. The system includes a memory storing an initial velocity profile for growing a taper portion of the crystal and storing a target taper slope. The crystal drive unit pulls the crystal from the melt at a target pull rate substantially following the velocity profile. The system also includes a controller receiving and responsive to information representative of crystal diameter and crystal length during pulling of the taper portion of the crystal. The controller calculates a taper slope measurement as a function of the change in the crystal diameter relative to the change in the crystal length. The controller also generates an error signal as a function of the difference between the taper slope measurement and the target taper slope and provides a pull rate correction to the crystal drive unit as a function of the error signal. The crystal drive unit adjusts the pull rate according to the pull rate correction to reduce the difference between the taper slope measurement and the target taper slope. In this manner, the system controls the growth of the taper portion of the crystal based on the taper slope.

Alternatively, the invention may comprise various other methods and systems.

Other objects and features will be in part apparent and in part pointed out hereinafter.

BRIEF DESCRIPTION OF THE DRAWINGS

Corresponding reference characters indicate corresponding parts throughout the drawings.

DETAILED DESCRIPTION OF PREFERRED EMBODIMENTS

Figure 1:
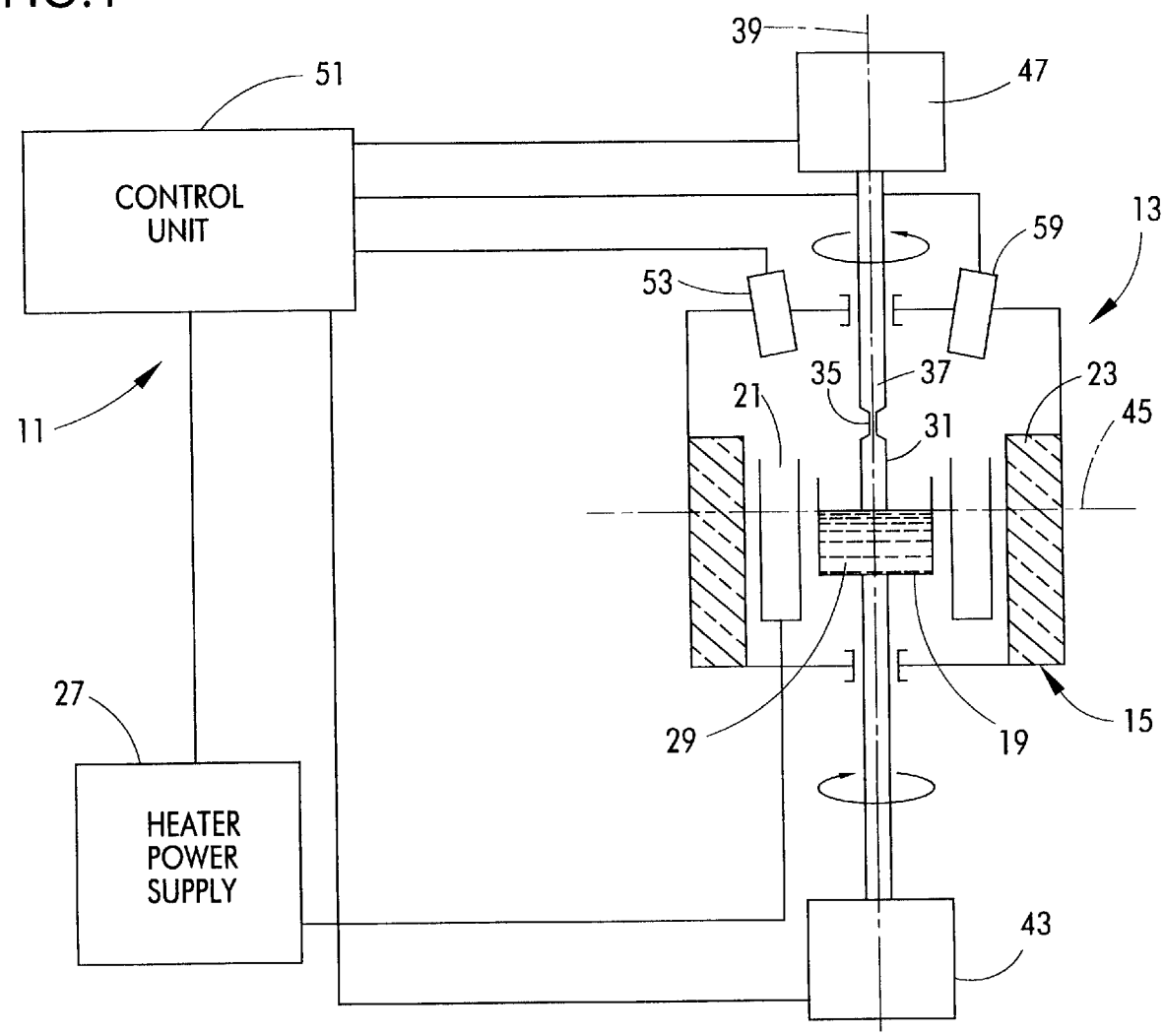
FIG. 1 is an illustration of a crystal growing apparatus and a system for controlling the crystal growing apparatus according to a preferred embodiment of the invention.

Referring now to FIG. 1, a system, indicated generally at 11, is shown for use with a Czochralski crystal growing apparatus, indicated generally at 13. The details of construction of the crystal growing apparatus 13 are well known to those of ordinary skill in the art. In general, crystal growing apparatus 13 includes a vacuum chamber 15 enclosing a crucible 19. Heating means such as a resistance heater 21 surrounds the crucible 19. In one embodiment, insulation 23 lines the inner wall of vacuum chamber 15 and a chamber cooling jacket (not shown) fed with water surrounds it. A vacuum pump (not shown) typically removes gas from within the vacuum chamber 15 as an inert atmosphere of argon gas is fed into it.

According to the Czochralski single crystal growth process, a quantity of polycrystalline silicon, or polysilicon, is charged to crucible 19. A heater power supply 27 provides electric current through the resistance heater 21 to melt the charge and, thus, form a silicon melt 29 from which a single crystal 31 is pulled. As is known in the art, the single crystal 31 starts with a seed crystal 35 attached to a pull shaft, or cable, 37. As shown in FIG. 1, single crystal 31 and crucible 19 generally have a common axis of symmetry 39. One end of cable 37 is connected to a drum (not shown) and the other end is connected to a chuck (not shown) that holds the seed crystal 35 and the crystal 31 grown from the seed crystal.

During both heating and crystal pulling, a crucible drive unit 43 rotates crucible 19 (e.g., in the clockwise direction). The crucible drive unit 43 also raises and lowers crucible 19 as desired during the growth process. For example, crucible drive unit 43 raises crucible 19 as the melt 29 is depleted to maintain its level, indicated by reference character 45, at a desired height. A crystal drive unit 47 similarly rotates the cable 37 in a direction opposite the direction in which crucible drive unit 43 rotates crucible 19. In addition, the crystal drive unit 47 raises and lowers crystal 31 relative to the melt level 45 as desired during the growth process.

In one embodiment, crystal growth apparatus 13 preheats the seed crystal 35 by lowering it nearly into contact with the molten silicon of melt 29 contained by crucible 19. After preheating, crystal drive unit 47 continues to lower seed crystal 35 via cable 37 into contact with melt 29 at its melt level 45. As seed crystal 35 melts, crystal drive unit 47 slowly withdraws, or pulls, it from the melt 29. Seed crystal 35 draws silicon from melt 29 to produce a growth of silicon single crystal 31 as it is withdrawn. Crystal drive unit 47 rotates crystal 31 at a reference rate as it pulls crystal 31 from melt 29. Crucible drive unit 43 similarly rotates crucible 19 at another reference rate, but usually in the opposite direction relative to crystal 31.

A control unit 51 initially controls the withdrawal rate and the power that power supply 27 provides to heater 21 to cause a neck down of crystal 31. Preferably, crystal growth apparatus 13 grows the crystal neck at a substantially constant diameter as seed crystal 35 is drawn from melt 29. For example, the control unit 51 maintains a substantially constant neck diameter of about five percent of the desired body diameter. After the neck reaches a desired length, control unit 51 then adjusts the rotation, pull and/or heating parameters to cause the diameter of crystal 31 to increase in a cone-shaped manner until a desired crystal body diameter is reached. For example, the control unit 51 decreases the pull rate to create an outwardly flaring region typically referred to as the taper of the crystal.

Once the desired crystal diameter is reached, control unit 51 controls the growth parameters to maintain a relatively constant diameter as measured by system 11 until the process approaches its end. At that point, the pull rate and heating are usually increased for decreasing the diameter to form a tapered portion at the end of single crystal 31. Commonly assigned U.S. Pat. No. 5,178,720, the entire disclosure of which is incorporated herein by reference, discloses one preferred method for controlling crystal and crucible rotation rates as a function of the crystal diameter.

Preferably, control unit 51 operates in combination with at least one two-dimensional camera 53 to determine a plurality of parameters of the growth process including melt level 45. Camera 53 is mounted above a viewport (not shown) of chamber 15 and aimed generally at the intersection of longitudinal axis 39 and melt level 45 (see FIG. 3). Commonly assigned U.S. Pat. No. 5,882,402, U.S. Pat. No. 5,846,318, U.S. Pat. No. 5,665,159 and U.S. Pat. No. 5,653,799, the entire disclosures of which are incorporated herein by reference, provide accurate and reliable measurements of a number of crystal growth parameters, including crystal diameter. In these patents, an image processor processes images of the crystal-melt interface from camera 53 to determine the diameter.

In addition to processing signals from camera 53, control unit 51 processes signals from other sensors. For example, a temperature sensor 59, such as a photo cell, may be used to measure the melt surface temperature.

Figure 2:
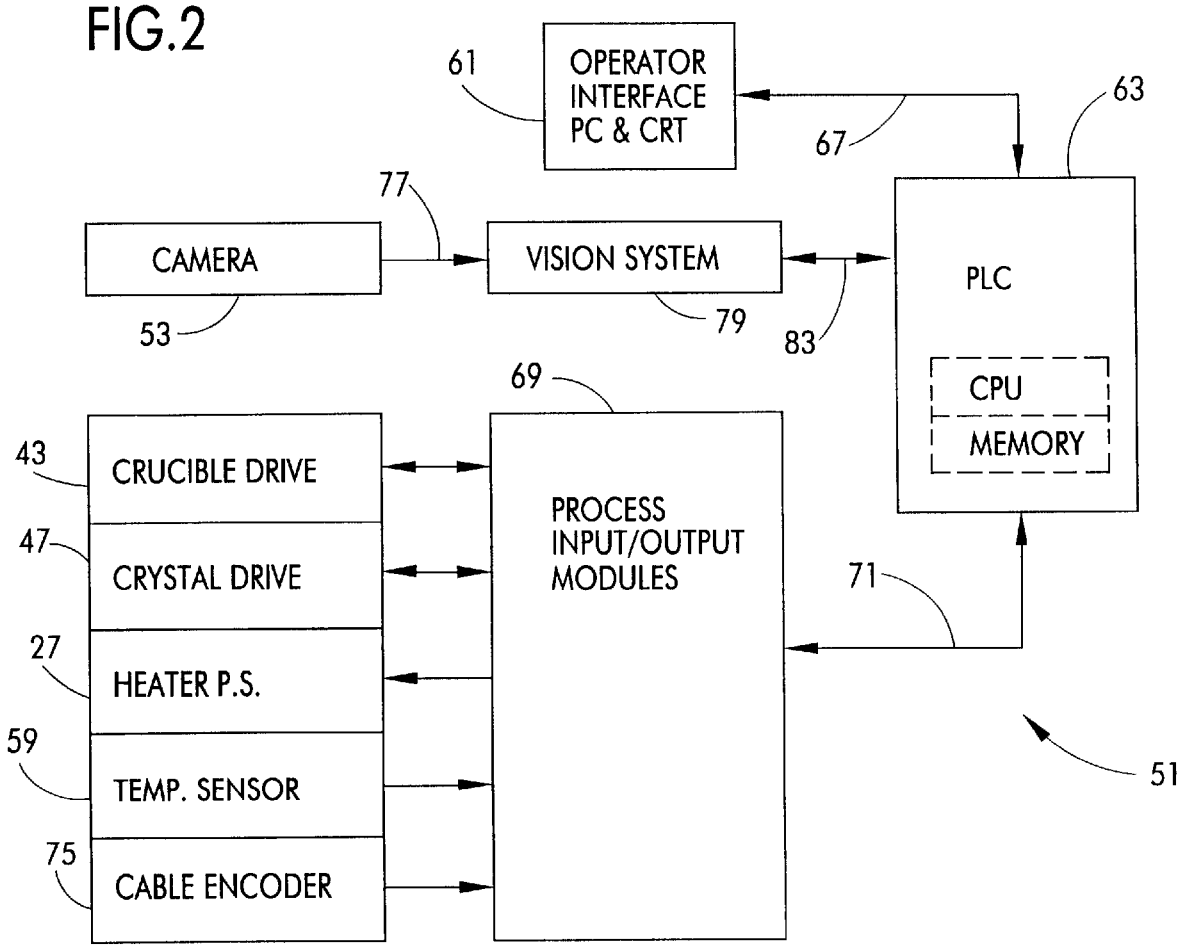
FIG. 2 is a block diagram of a control unit of the system of FIG. 1.

FIG. 2 illustrates a preferred embodiment of control unit 51 in block diagram form. Control unit 51 includes a programmed digital or analog computer 61 for use in controlling, among other things, crucible drive unit 43, single crystal drive unit 47 and heater power supply 27 as a function of processed signals from camera 53 and other sensors. As shown in FIG. 2, a programmable logic controller (PLC) 63 communicates with the computer 61 via line 67 (e.g., RS-232 cable) and with one or more process input/output modules 69 via line 71 (e.g., RS-485 cable). According to the invention, computer 61 provides an operator interface that permits the operator of crystal growing apparatus 13 to input a set of desired parameters for the particular crystal being grown.

The process input/output module 69 provides a path to and from crystal growing apparatus 13 for controlling the growth process. As an example, the PLC 63 receives information regarding the melt temperature from temperature sensor 59 and outputs a control signal to heater power supply 27 via process input/output module 69 for controlling the melt temperature thereby controlling the growth process.

Similarly, PLC 63 receives an input signal from an encoder 75 producing pulses that vary as a function of the rotational movement of the drum in crystal drive unit 47. PLC 63 is readily programmed via conventional means to convert the number of pulses received from the encoder 75 into a numeric figure representing the linear movement of cable 37 in real time. In other words, PLC 63 calculates the velocity of cable 37 and, thus, the pull rate of crystal 31. Crystal drive unit 47 preferably includes a motor (not shown) for driving the drum that reels pull cable 37 up and down. In one embodiment, a servo amplifier (not shown) and a motor speed tachometer (not shown) communicate with the motor in a conventional closed loop feedback arrangement. PLC 63 preferably provides a set point signal to the servo amplifier of crystal drive unit 47 for adjusting the speed of the motor as a function of the signal provided by encoder 75.

Referring further to FIG. 2, camera 53 communicates video images of the interior of crucible 19 via line 77 (e.g., RS-170 video cable) to a vision system 79 providing edge detection and diameter measurement calculations. In turn, vision system 79 communicates with PLC 63 via line 83. In one preferred embodiment, PLC 63 is a Model TI575 PLC manufactured by Siemens or a Model 545 PLC manufactured by Texas Instruments and line 83 represents a communications interface (e.g., VME backplane interface). Depending on the particular controller embodying PLC 63, the communications interface 83 may be, for example, a custom VME rack that includes an additional communications board (e.g., Model 2571 Program Port Expander Module using the RS-422 serial bidirectional PLC port).

Although described in connection with vision system 79, it is to be understood that crystal diameter measurements may be determined by other methods. For example, several technologies are known for providing crystal diameter measurements including methods of measuring the width of the bright ring. The bright ring is a characteristic of the reflection of the crucible wall in the meniscus that is formed at the solid-liquid interface of crystal 31. Conventional bright ring and meniscus sensors employ optical pyrometers, photocells, rotating mirrors with photocells, light sources with photocells, line-scan cameras, and two-dimensional array cameras.

Figure 3:
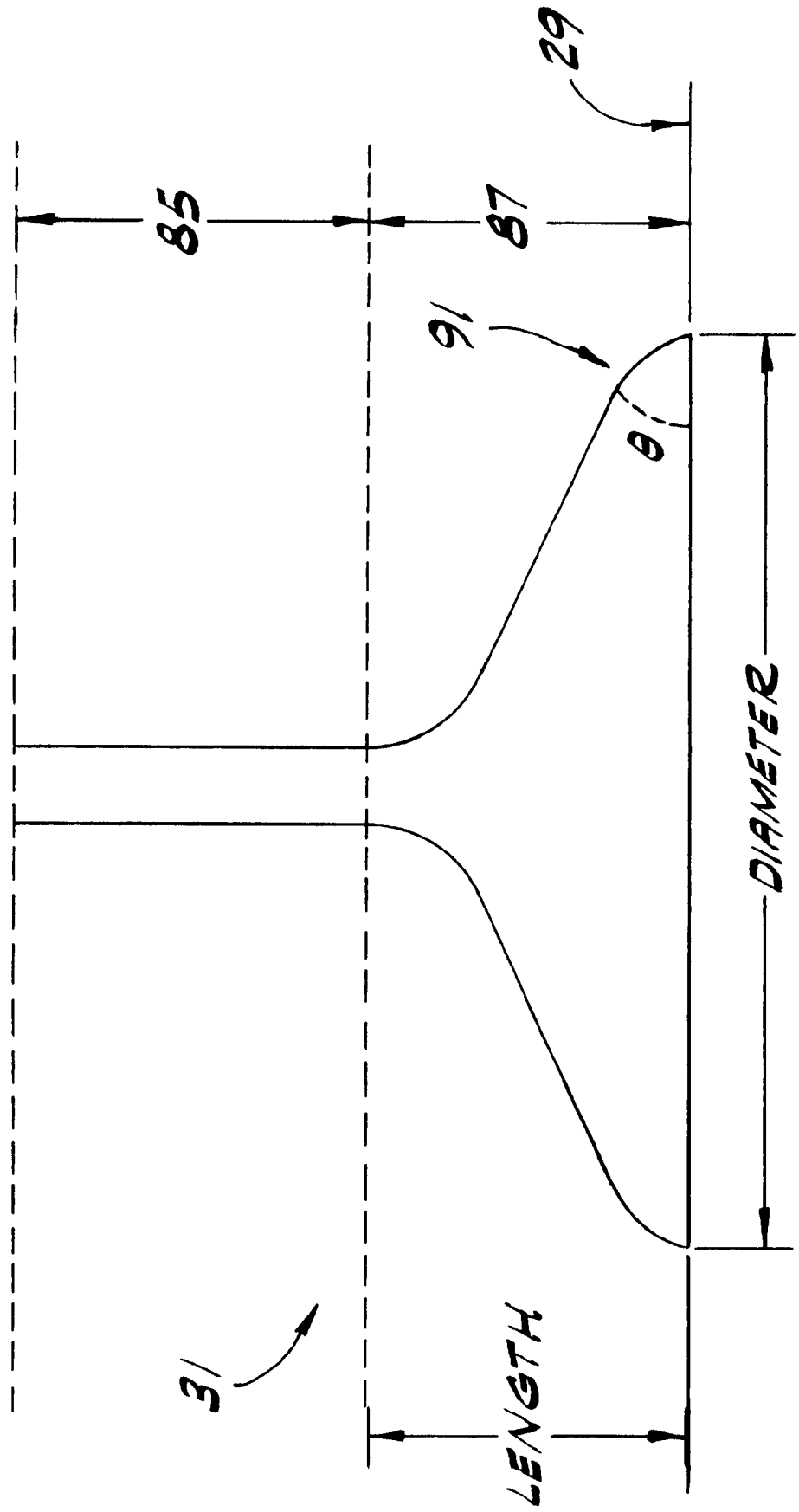
FIG. 3 is a fragmentary side view of taper growth of a semiconductor crystal being pulled from a melt contained in the crystal growing apparatus of FIG. 1.

FIG. 3 illustrates a relatively early phase of the crystal growth process following meltdown and dipping of seed crystal 35. After formation of a crystal neck 85, the typical process enlarges the diameter of the growing crystal 31 by decreasing the pulling rate and/or the melt temperature until a desired diameter is reached. This portion of increasing diameter is referred to as a taper, or crown, 87. As the taper 87 increases to a desired diameter, crystal 31 forms a shoulder, indicated generally at 91, followed by a main body (not shown in FIG. 3). As melt 29 approaches depletion, the crystal diameter is gradually decreased resulting in the formation of a generally conical end cone (not shown in FIG. 3) of crystal 31. Once the diameter of the end cone is sufficiently small (e.g., 2 mm to 4 mm), detachment of crystal 31 from melt 29 can be accomplished without causing dislocations to spread to the main body of crystal 31. Crystal 31 is then removed from vacuum chamber 15 for processing into wafers. By controlling the pull rate and the melt temperature while compensating for the decreasing melt level, the body of crystal 31 is grown so that it has an approximately constant diameter and constitutes a generally cylindrical body of crystalline silicon (i.e., an ingot). It should be understood that the as-grown crystal body typically will not have an entirely uniform diameter, although it is generally cylindrical. Further, the diameter of crystal 31 varies in the different phases of crystal growth (i.e., seed 35, neck 85, taper 87, body and end cone).

As taper 87 is growing, diameter information and information on vertical distance raised is fed into PLC 63. Using the change in diameter and the change in length, the angle θ can be calculated using the formula:

$$\theta = \tan^{-1}(2\Delta L / \Delta D)$$

where $\Delta L$ is the change in length and $\Delta D$ is the change in diameter.

Figure 4:
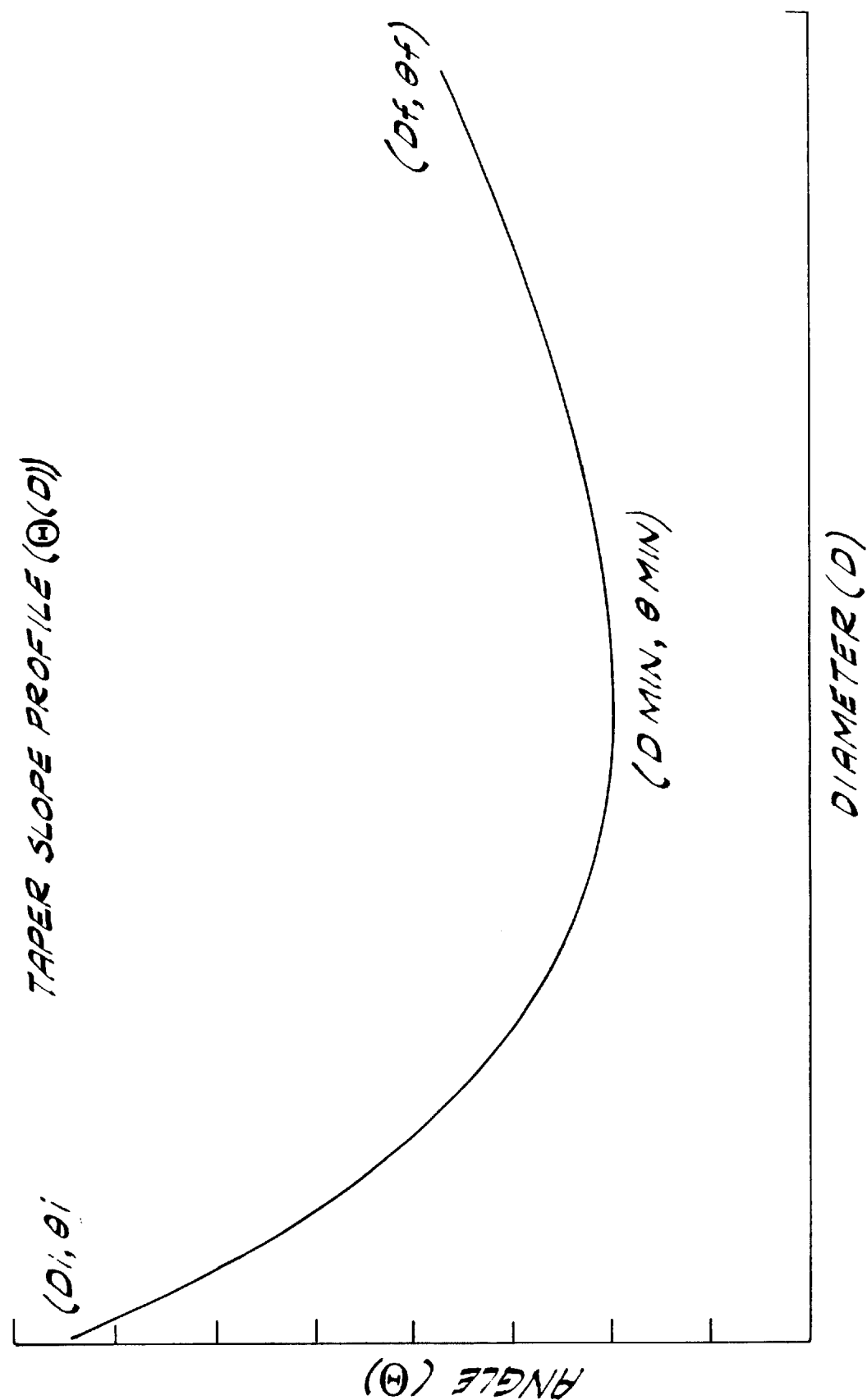
FIG. 4 is an exemplary taper slope profile θ(D)) illustrating taper slope as a function of crystal diameter.

Referring now to FIG. 4, control based on calculated angle tends to be erratic, but if the inverse of the ratio (i.e., $\Delta D/2\Delta D$) is used, control is much smoother. In addition, diameter measurement variation can cause $\Delta D$ to be zero, resulting in an undefined condition computationally. According to the invention, PLC 63 executes a control routine to maintain the measured taper slope at or near a target slope. The target slope at a given diameter is calculated from a slope function as indicated in FIG. 4. This function contains both an exponential and a linear component, and is represented by the formula:

$$\theta(D) = (\theta_i - b)e^{-D/\lambda} + mD + b$$

where $\theta$=taper slope angle; D =taper diameter; $\lambda$=decay constant for exponential component; and m and b are the slope and intercept for the linear component. Given three points on the curve, namely $(D_i, \theta_i)$, $(D_{min}, \theta_{min})$ and $(D_f, \theta_f)$ and given $\lambda$, then m and b can be solved for to give the complete equation. The exponential component of the slope function is desired since the taper shape will respond to a step change in pull rate with an exponential shape as shown in Kim et al., "Computer Simulation and Controlled Growth of Large Diameter CZ Silicon Crystals," *J. Electrochem. Soc.:SOLID-STATE SCIENCE AND TECHNOLOGY,* pp.1156–60 (May 1983). Adjustments to the pull rate during the active control of taper 87 should thus more naturally fit to the exponential shape. In FIG. 4, the portion of the curve from point $(D_i, \theta_i)$ to point $(D_{min}, \theta_{min})$ is largely exponential and the portion of the curve from point $(D_{min}, \theta_{min})$ to point $(D_f, \theta_f)$ is largely linear.

In certain conventional growth processes, crystal lifting unit 47 pulls the taper portion of single crystal 31 from melt 29 according to a predetermined velocity profile. This velocity profile is specified in a crystal "recipe" and often referred to as "locked" or "fixed" seed lift. In contrast, conventional Czochralski silicon growth processes usually vary the seed lift, or pull rate, to control the diameter of the main body of growing crystal 31. Those skilled in the art recognize that increasing pull rate causes a reduction in crystal diameter while decreasing the pull rate causes an increase in diameter. It is also well known that increasing the temperature of the silicon source melt 14 causes a reduction in crystal diameter while decreasing the melt temperature causes an increase in diameter.

Figure 5:
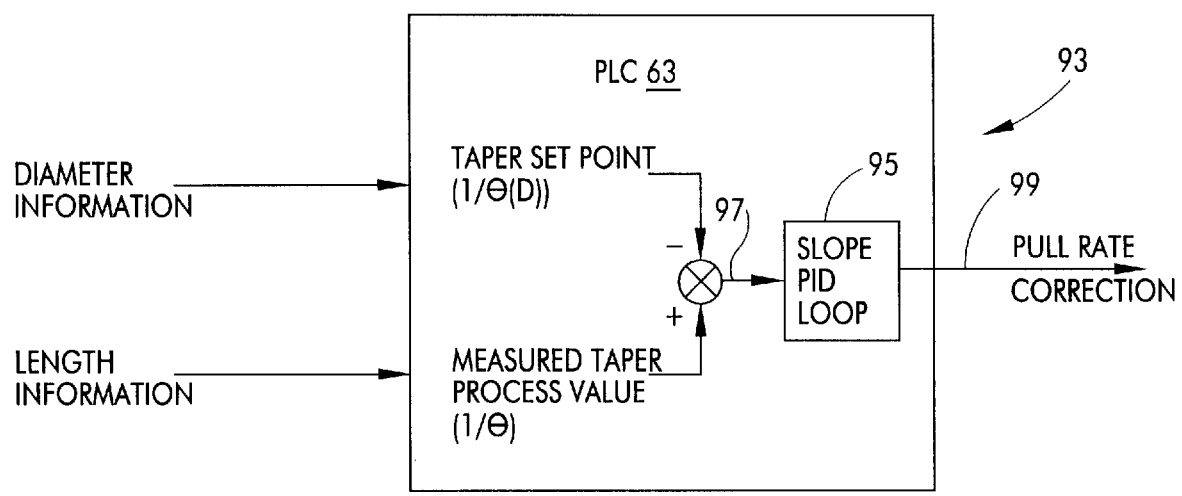
FIG. 5 is a block diagram illustrating control of the crystal growth process according to the taper slope profile θ(D) of FIG. 4.

Advantageously, a preferred embodiment of the present invention involves a predetermined temperature profile but provides for adjustment of the pull rate while the taper 87 of crystal 31 is being grown. FIG. 5 is a block diagram of a control loop, generally indicated at 93, illustrating control of the crystal growth process according to the taper slope profile $\theta(D)$ shown in FIG. 4. As described above, PLC 63 receives information regarding the diameter of the growing crystal 31 as well as its length. In this embodiment, vision system 79 and cable encoder 75 provide the crystal diameter and length information, respectively. Based on this information, PLC 63 calculates a measured taper slope $\theta$ as a function of the diameter and length changes (ie., $\theta$=tan$-1(2\Delta L/\Delta D)$. Since control based on the calculated angle tends to be erratic, the control loop 93 uses the inverse of the measured slope as the process variable corresponding to the slope of taper 87 at a particular location.

As shown in FIG. 5, a proportional-integral-derivative (PID) control loop 95 receives an error signal at line 97. The error signal represents the difference between the inverse of the desired, or target, taper slope (i.e., the set point) and the inverse of the actual taper slope (i.e., the process variable). In this instance, the slope of the growing taper 87 is measured and compared to a predetermined set point derived from the function of FIG. 4. The slope PID loop 95 outputs a pull rate correction at line 99 for adjusting the pull rate, which is obtained from the particular crystal growing recipe. Thus, pull rate is adjusted so that it fits taper 87 to this function and keeps the measured taper slope close to the target slope.

In view of the above, it will be seen that the several objects of the invention are achieved and other advantageous results attained.

As various changes could be made in the above constructions and methods without departing from the scope of the invention, it is intended that all matter contained in the above description or shown in the accompanying drawings shall be interpreted as illustrative and not in a limiting sense.

What is claimed is:

1. A control method for use in combination with a crystal growing apparatus for growing a semiconductor single crystal according to the Czochralski process, said crystal growing apparatus having a heated crucible containing a semiconductor melt from which the crystal is grown, said crystal being grown on a seed crystal pulled from the melt, said method comprising the steps of:

pulling the growing crystal from the melt at a target pull rate, said target pull rate substantially following an initial velocity profile for growing a taper portion of the crystal;

measuring a slope of the taper portion of the crystal, said measured taper slope being a function of a change in crystal diameter relative to a change in crystal length during pulling of the taper portion of the crystal;

defining a target taper slope;

generating an error signal as a function of the difference between the measured taper slope and the target taper slope;

adjusting the pull rate as a function of the error signal to reduce the difference between the measured taper slope and the target taper slope; and pulling the crystal from the melt at the adjusted target pull rate thereby changing the measured slope of the taper portion of the crystal to control the growth of the crystal.

2. The method of claim 1 further comprising the steps of performing proportional-integral-derivative (PID) control on the error signal and generating a pull rate correction as a function thereof and wherein the step of adjusting the pull rate includes adjusting the pull rate according to the pull rate correction.

3. The method of claim 2 further comprising the steps of defining a process variable of the PID control as an inverse function of the measured taper slope and defining a set point of the PID control as an inverse function of the target taper slope and wherein the step of generating the error signal includes generating the error signal as a function of the difference between the process variable and the set point.

4. The method of claim 1 further comprising the steps of measuring the crystal diameter and the crystal length and defining the measured taper slope as a function thereof.

5. The method of claim 1 further comprising the step of heating the crucible according to a predetermined melt heater power profile.

6. The method of claim 5 further comprising the step of adjusting the melt heater power in response to errors in pull rate from a predetermined pull rate target profile.

7. A control system for use in combination with a crystal growing apparatus for growing a semiconductor single crystal according to the Czochralski process, said crystal growing apparatus having a heated crucible containing a semiconductor melt from which the crystal is grown, said crystal being grown on a seed crystal pulled from the melt by a crystal drive unit, said system comprising:

a memory storing an initial velocity profile for growing a taper portion of the crystal and storing a target taper slope, said crystal drive unit pulling the growing crystal from the melt at a target pull rate substantially following the velocity profile;

a controller receiving and responsive to information representative of crystal diameter and crystal length during pulling of the taper portion of the crystal, said controller:

calculating a taper slope measurement as a function of the change in the crystal diameter relative to the change in the crystal length;

generating an error signal as a function of the difference between the taper slope measurement and the target taper slope; and providing a pull rate correction to the crystal drive unit as a function of the error signal, said crystal drive unit adjusting the pull rate according to the pull rate correction to reduce the difference between the taper slope measurement and the target taper slope thereby controlling the growth of the taper portion of the crystal based on the taper slope.

8. The system of claim 7 wherein the controller includes a proportional-integral-derivative (PID) control on the error signal, said PID control generating the pull rate correction as a function of the error signal.

9. The system of claim 8 wherein the PID control has a process variable defined as an inverse function of the taper slope measurement and a set point defined as an inverse function of the target taper slope and wherein the error signal represents the difference between the process variable and the set point.

10. The system of claim 7 wherein the target taper slope is defined by a function having a generally exponential component and a generally linear component.

11. The system of claim 7 wherein the crystal growing apparatus includes a heater for heating the crucible, said heater being responsive to the controller for heating the crucible according to a predetermined melt heater power profile stored in the memory.

12. The system of claim 11 wherein the melt heater power is adjusted in response to errors in pull rate from a predetermined pull rate target profile.

13. A control method for use in combination with a crystal growing apparatus for growing a semiconductor single crystal according to the Czochralski process, said crystal growing apparatus having a heated crucible containing a semiconductor melt from which the crystal is grown, said crystal being grown on a seed crystal pulled from the melt, said method comprising the steps of:

pulling the growing crystal from the melt at a target pull rate, said target pull rate substantially following an initial velocity profile for growing a taper portion of the crystal;

measuring a slope of the taper portion of the crystal, said measured taper slope being a function of a change in crystal diameter relative to a change in crystal length during pulling of the taper portion of the crystal and defined by:

$$\theta = \tan^{-1}(2\Delta L/\Delta D)$$

where $\Delta$ is the measured taper slope; $\Delta L$ is the change in crystal length;

and $\Delta D$ is the change in crystal diameter;

defining a target taper slope;

generating an error signal as a function of the difference between the measured taper slope and the target taper slope;

adjusting the pull rate as a function of the error signal to reduce the difference between the measured taper slope and the target taper slope; and pulling the crystal from the melt at the adjusted target pull rate thereby changing the measured slope of the taper portion of the crystal to control the growth of the crystal.

14. A control method for use in combination with a crystal growing apparatus for growing a semiconductor single crystal according to the Czochralski process, said crystal growing apparatus having a heated crucible containing a semiconductor melt from which the crystal is grown, said crystal being grown on a seed crystal pulled from the melt, said method comprising the steps of:

pulling the growing crystal from the melt at a target pull rate, said target pull rate substantially following an initial velocity profile for growing a taper portion of the crystal;

measuring a slope of the taper portion of the crystal, said measured taper slope being a function of a change in crystal diameter relative to a change in crystal length during pulling of the taper portion of the crystal;

defining a target taper slope by a function having a generally exponential component and a generally linear component;

generating an error signal as a function of the difference between the measured taper slope and the target taper slope;

adjusting the pull rate as a function of the error signal to reduce the difference between the measured taper slope and the target taper slope; and pulling the crystal from the melt at the adjusted target pull rate thereby changing the measured slope of the taper portion of the crystal to control the growth of the crystal.

15. The method of claim 14 wherein the target taper slope function is as follows:

$$\theta(D) = (\theta_i - b)e^{-D/\lambda} + mD = b$$

where $\theta_i$ is an initial taper slope angle; D is the taper diameter; $\lambda$ is a decay constant for the exponential component of the function; and m and b are the slope and intercept, respectively, for the linear component of the function.

16. A control system for use in combination with a crystal growing apparatus for growing a semiconductor single crystal according to the Czochralski process, said crystal growing apparatus having a heated crucible containing a semiconductor melt from which the crystal is grown, said crystal being grown on a seed crystal pulled from the melt by a crystal drive unit, said system comprising:

a memory storing an initial velocity profile for growing a taper portion of the crystal and storing a target taper slope, said crystal drive unit pulling the growing crystal from the melt at a target pull rate substantially following the velocity profile;

a controller receiving and responsive to information representative of crystal diameter and crystal length during pulling of the taper portion of the crystal, said controller:

calculating a taper slope measurement as a function of the change in the crystal diameter relative to the change in the crystal length, said taper slope being defined by:

$$\theta = \tan^{-1}(2/\Delta D)$$

where $\theta$ is the measured taper slope; $\Delta L$ is the change in crystal length;

and $\Delta D$ is the change in crystal diameter;

generating an error signal as a function of the difference between the taper slope measurement and the target taper slope; and providing a pull rate correction to the crystal drive unit as a function of the error signal, said crystal drive unit adjusting the pull rate according to the pull rate correction to reduce the difference between the taper slope measurement and the target taper slope thereby controlling the growth of the taper portion of the crystal based on the taper slope.

17. A control system for use in combination with a crystal growing apparatus for growing a semiconductor single crystal according to the Czochralski process, said crystal growing apparatus having a heated crucible containing a semiconductor melt from which the crystal is grown, said crystal being grown on a seed crystal pulled from the melt by a crystal drive unit, said system comprising:

a memory storing an initial velocity profile for growing a taper portion of the crystal and storing a target taper slope, said crystal drive unit pulling the growing crystal from the melt at a target pull rate substantially following the velocity profile;

a controller receiving and responsive to information representative of crystal diameter and crystal length during pulling of the taper portion of the crystal, said controller:

calculating a taper slope measurement as a function of the change in the crystal diameter relative to the change in the crystal length, said target taper slope being defined by a function having a generally exponential component and a generally linear component;

generating an error signal as a function of the difference between the taper slope measurement and the target taper slope; and providing a pull rate correction to the crystal drive unit as a function of the error signal, said crystal drive unit adjusting the pull rate according to the pull rate correction to reduce the difference between the taper slope measurement and the target taper slope thereby controlling the growth of the taper portion of the crystal based on the taper slope.

18. The system of claim 17 wherein the target taper slope function is as follows:

$$\theta(D)=(\theta_i-b)e^{-D/\lambda}+mD+b$$

where $\theta_i$ is an initial taper slope angle; D is the taper diameter, $\lambda$ is a decay constant for the exponential component of the function; and m and b are the slope and intercept, respectively, for the linear component of the function.

* * * * *

UNITED STATES PATENT AND TRADEMARK OFFICE
CERTIFICATE OF CORRECTION

PATENT NO. : 6,241,818 B1
DATED : June 5, 2001
INVENTOR(S) : Steven L. Kimbel and Robert R. Wyand, III It is certified that error appears in the above-identified patent and that said Letters Patent is hereby corrected as shown below:

Column 9, claim 10,
Line 26-28, original claim 14 (now claim 10) cancelled by Amendment A.

Column 9, claim 13,
Line 53, "$\theta=\tan{-1}(2\Delta L/\Delta D)$" should read -- $\theta=\tan^{-1}(2\Delta L/\Delta D)$ --.
Line 54, "where $\lambda$ is" should read -- where $\theta$ is --.

Column 10, claim 15,
Line 33, "$\theta(D)=(\theta_i-b)e^{-D/\lambda}+mD=b$" should read -- $\theta(D)=(\theta_i-b)e^{-D/\lambda}+mD+b$ --.

Column 10, claim 16,
Line 60, "$\theta=\tan{-1}(2/\Delta D)$" should read -- $\theta=\tan{-1}(2\Delta L/\Delta D)$ --.

Column 12, claim 18,
Line 19, "$\theta(D)=(\theta_i-b)e^{-D/\lambda}+mD=b$" should read -- $\theta(D)=(\theta_i-b)e^{-D/\lambda}+mD+b$ --.

Signed and Sealed this

Second Day of April, 2002

Attest:

JAMES E. ROGAN
*Director of the United States Patent and Trademark Office*

*Attesting Officer*